United States Patent
Bao et al.

(10) Patent No.: US 7,626,461 B2
(45) Date of Patent: Dec. 1, 2009

(54) TRANSCONDUCTANCE STAGE ARRANGEMENT

(75) Inventors: Mingquan Bao, Västra Frölunda (SE); Yinggang Li, Askim (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 32 days.

(21) Appl. No.: 12/090,710

(22) PCT Filed: Oct. 20, 2005

(86) PCT No.: PCT/SE2005/001564

§ 371 (c)(1),
(2), (4) Date: Apr. 18, 2008

(87) PCT Pub. No.: WO2007/046732

PCT Pub. Date: Apr. 26, 2007

(65) Prior Publication Data

US 2008/0265992 A1    Oct. 30, 2008

(51) Int. Cl.
*H03F 3/04* (2006.01)

(52) U.S. Cl. .................................................. 330/301

(58) Field of Classification Search ................. 330/301, 330/252, 117, 148
See application file for complete search history.

(56) References Cited

U.S. PATENT DOCUMENTS

| 5,929,710 | A | * | 7/1999 | Bien | 330/301 |
| 5,999,804 | A | * | 12/1999 | Forgues | 455/333 |
| 2009/0108943 | A1 | * | 4/2009 | Kuo et al. | 330/301 |

* cited by examiner

*Primary Examiner*—Robert Pascal
*Assistant Examiner*—Hieu P Nguyen
(74) *Attorney, Agent, or Firm*—Michael G. Cameron

(57) ABSTRACT

The present invention relates to a voltage-to-current transconductance stage arrangement comprising a single-ended input, an emitter-coupled pair of transistors, comprising a first transistor and a second transistor, the emitter of a third transistor, being connected to the collector of said first transistor, and differential output. It further comprises at least one common-collector transistor comprising a fourth transistor connected to the base of said second transistor preferably or optionally also and a fifth transistor connected to the base of said third transistor. The size of said fourth, or fourth and fifth transistors considerably exceed the sizes of said second and third transistors. They are biased at 'off-state'. An extra inductor at the collector of the transistor may be applied to further increase linearity.

22 Claims, 5 Drawing Sheets

TRANSCONDUCTANCE STAGE ARRANGEMENT

FIELD OF THE INVENTION

The present invention relates to a voltage-to-current transconductance stage arrangement comprising a single-ended input, an emitter-coupled pair of transistors comprising a first and a second transistor, whereby the emitter of a third transistor is connected to the collector of said first transistor, and a differential output. The invention also relates to a mixer and an amplifier comprising a transconductance stage arrangement.

STATE OF THE ART

In many different kinds of circuits it is a requirement that the linearity is high. Examples of such arrangements or components are receivers and radio transmitters in wireless communication systems. Often the linearity of such arrangements is determined to a large extent, or mainly, by the linearity of amplifiers and mixers used in the system. Important for the linearity of such amplifiers or mixers, is the voltage-to-current transconductance stage which actually to a large extent constitutes the limiting factor as far as the linearity is concerned.

Balanced circuits are often advantageous for several reasons compared to single-ended circuits. For example they are capable of cancelling the RF (Radio Frequency) signal at the output of a mixer used for frequency down-conversion. In order to be able to build a balanced circuit, often a single-ended input to differential output stage is needed. Such a stage can be provided in different ways. For instance, it is known to use a single-ended input to differential output passive balun (balanced-unbalanced circuit) before the transconductance stage. A passive balun consisting of inductors and capacitors however requires a large chip area and normally introduces losses, which is clearly disadvantageous.

It is also known to use an active circuit acting as a balun and a transconductance stage simultaneously, comprising an emitter-coupled-pair (ECP). Such a single-to-differential emitter-coupled pair $10_{01}$ is shown in FIG. 1. A transconductance stage of this kind can be made very compact and may also provide a gain in voltage-to-current conversion.

In order to improve the linearity of the ECP transconductance stage, emitter degeneration techniques are often used. An example of such an arrangement $10_{02}$ is illustrated in FIG. 2 wherein resistors $R_{e1}$, $R_{e2}$ are introduced at the emitter side of the respective transistors $Q_{01}$, $Q_{02}$.

Linearity can also be enhanced by implementing the multi-tan h principle as described in "The multi-tan h principle: a tutorial overview", IEEE J. Solid-State Circuits, Vol. 33, no. 1, January 1998 by Barrie Gilbert. Parallel connected sets of differential pairs (EPC) of transistors are then used. Such transconductance cells or stages are known as the multi-tan h principle based cells, the main idea being that the individually non-linear (hyperbolic tangent, tan h) transconductance functions may be separated along the input-voltage axis in order to achieve a more linear overall function. The simplest one is the so-called "doublet", but other, for example the "triplet" are also known.

FIG. 3 illustrates a simplified implementation of a multi-tan h doublet $10_{03}$. In FIG. 3 a so-called multi-tan h doublet is shown which comprises two emitter-coupled pairs acting in parallel. The (physical) sizes of transistors $Q_{01}$ and $Q_{04}$ are typically several times different from the sizes of $Q_{02}$ and $Q_{03}$ which is the other emitter-coupled pair. However, even if the linearity can be increased, there will be a decrease of gain in transconductance compared with an EPC and, addition thereto, the actual linearity improvement is limited due to the fundamental weakness of the emitter-coupled pair. The reason that the linearity is limited for emitter-coupled pairs is that the incremental transconductance $g_m$ of the transistors in the emitter-coupled pair decreases considerably with increasing input voltage applied across the bases of the transistors.

Therefor mixers and amplifiers based on an ECP transconductance stage are often considered insufficient as far as the fulfillment of linearity requirements are concerned for many applications.

In "The micromixer: A highly linear variant of the Gilbert Mixer using a bisymmetric class-AB input stage", IEEE Journal of Solid-State Circuits, Vol. 32, no. 9, September 1997, by Barrie Gilbert a solution to the problem referred to above is suggested. A simplified circuit diagram of the transconductance stage used in a so-called micromixer is schematically illustrated in FIG. 4. The output currents I+ and I− for a given input signal $V_{in}$ should be equal in amplitude and opposite in phase. The resistors $R_{01}$, $R_{02}$ and $R_{03}$ are used to increase the input impedance since, the input impedance of $Q_{02}$ and $Q_{03}$ normally is quite low. However, even if the linearity can be improved as compared to ECP implementations, it is a problem with micromixer transconductances that the linearity deteriorates or goes down rapidly as the input RF power increases further. This is due to the fact that the DC component of a base-emitter voltage of $Q_{02}$ and $Q_{03}$, $V_{be}$, decreases as the input RF power increases. This gives rise to gain compression and causes signal distortions. The reason for the decrease of $V_{be}$ can be explained as follow: When the input power increases, DC currents $I_{DC}$ through the emitters of $Q_{02}$ and $Q_{03}$ increase. Thus the DC voltage $V_{be}(Q_{02})+V_{be}(Q_{03})=V_b-I_{DC}(R_{03}+R_{02})$ decreases, $V_b$ being the biasing voltage at the base of $Q_{03}$. It has here been assumed that the DC currents $I_{DC}$ through $Q_{02}$ and $Q_{03}$ are equal and the emitter resistors of the transistors are included in $R_{02}$ and $R_{03}$.

Hence, there are today still no transconductances with a satisfactory linearity for several important applications, for example in wireless communication systems, but also for other applications.

SUMMARY OF THE INVENTION

What is needed is therefore a voltage-to-current transconductance stage arrangement as initially referred to which has a good or high linearity. Particularly a transconductance stage with a function of single-input to differential-output balun is needed which is compact and which does not consume a large chip area and still is highly linear. Even more particularly an arrangement is needed which has a high linearity without there being any losses in transconductivity. Particularly a transconductance stage is needed which is not limited due to for example ECP weakness as discussed above or particularly which is such that the linearity and the transconductivity can be kept also with an increased input voltage. Particularly a transconductance stage is needed which tolerates high input signals (high input voltages) and which have a large dynamical range. Most particularly transconductance stages are needed which are cheap and easy to fabricate and which are not complex. Most particularly transconductance stages are needed which can be used to provide amplifiers and mixers and other components with a high linearity. Particularly a transconductance stage is needed which can be used in components for wireless communication systems, even more particularly receivers and transmitters of a radio requiring a high linearity. Moreover amplifiers, mixers, particularly receivers and transmitters are needed which are highly linear.

Therefore a voltage-to-current transconductance stage arrangement as initially referred to is provided which further comprises a common collector transistor comprising a fourth transistor connected to the base of said second transistor. Particularly the base of the fourth transistor is connected to the emitter of the third transistor (and the collector of the first transistor) and the emitter of the fourth transistor is connected to the base of the second transistor. In a particularly advantageous embodiment a fifth transistor is connected to the base of said third transistor. Preferably the sizes of said fourth or fourth and fifth transistor(s) respectively considerably exceed(s) the sizes of said second and third transistors. Particularly the emitter size of said fourth or fourth and fifth transistor respectively considerably exceed the emitter size of said second and third transistors. Particularly the emitter sizes of the fourth or fourth and fifth transistor respectively is about, or up to, N×the emitter size of the second and/or third transistor, wherein N is approximately 10.

Even more particularly the emitter size of said fourth and/or fifth transistor respectively is more than N×the emitter size of said second and/or third transistor respectively, wherein N>10, e.g. up to about 20. (N may of course also be smaller than 10, but normally not smaller than 4-5.)

In a particular embodiment the collector current of said fourth or fourth and fifth transistors is/are the base biasing currents of said second and third transistors respectively. Even more particularly the fourth or fourth and fifth transistors is/are biased in an "off-state", so that the collector currents are extremely small.

Particularly, for an increasing input power, the base-emitter voltage of said fourth a fourth and fifth transistors respectively is adapted to decrease rapidly, such that the corresponding DC-voltage components of the base-emitter voltages of said second and third transistors increase or do not change, hence providing a good linearity also at large RF input power.

In one embodiment resistors or inductors are provided at or connected to the emitters of said first and/or second and third transistors in order to further increase the input impedance of said transistors. Even more advantageously said fourth or fourth and fifth transistors is/are arranged to increase the input impedance of said first and/or second and third transistors to the desired level such that no further or no resistors are needed to increase the input impedance of said first, second and third transistors.

In one particular implementation a load inductor is arranged to load the collector of, particularly, the fourth transistor. A load inductor may also (or alternatively) be provided to load the collector of said fifth transistor, if included.

In one implementation the base-collector (BC) junction capacitor and the load inductor (that optionally may be provided as discussed above) form a tunable series resonator. Particularly the input signal, i.e. the input voltage, has a frequency $w_0$ and the tunable series resonator as discussed above is adapted to be tuned such that resonance will occur at twice the input frequency, i.e. at $2 \times \omega_0$, such that the second harmonic of the input signal will be shorted to ground at the input, in order to further increase the linearity by reducing the third order intermodulation due to the interaction between the component of $2 \times \omega_0$ and the fundamental one.

In particular implementations the transistors are bipolar transistors. More particularly the transconductance stage is implemented in SiGe or GaAs. It should be clear that also other materials can be used and it does not have to be bipolar transistors but FET or CMOS etc may also be possible. Particularly the arrangement comprises an integrated circuit (IC).

Therefore, in order to solve the problems referred to earlier, a mixer comprising a transconductance stage as discussed above is also provided. An amplifier may also be provided comprising a transconductance stage in agreement with any one of the embodiments discussed above. Most particularly a transconductance stage as discussed above is used in one or more components in a wireless communication system in order to provide for a high linearity for example in receivers and transmitters. Also other implementations are of course possible.

BRIEF DESCRIPTION OF THE DRAWINGS

The invention will in the following be further described, in a non-limiting manner, and with reference with the accompanying drawings, in which.

DETAILED DESCRIPTION OF THE INVENTION

Figure 1:
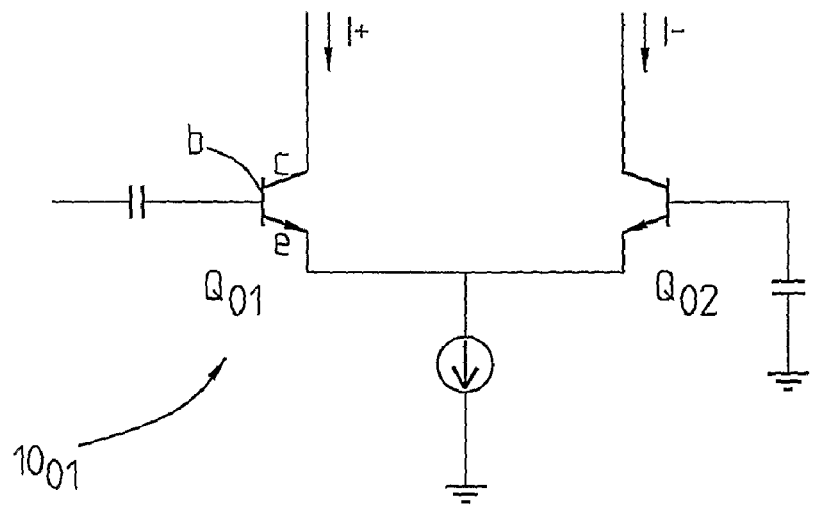
FIG. 1 shows a known active circuit acting as a single-to-differential balun and transconductance stage at the same time and comprising an emitter-coupled pair.

FIG. 1 very schematically illustrates an emitter-coupled pair (ECP) arrangement $10_{01}$ for an active circuit acting as a balun and a transconductance stage simultaneously with two emitter-coupled transistors $Q_{01}$, $Q_{02}$.

Figure 2:
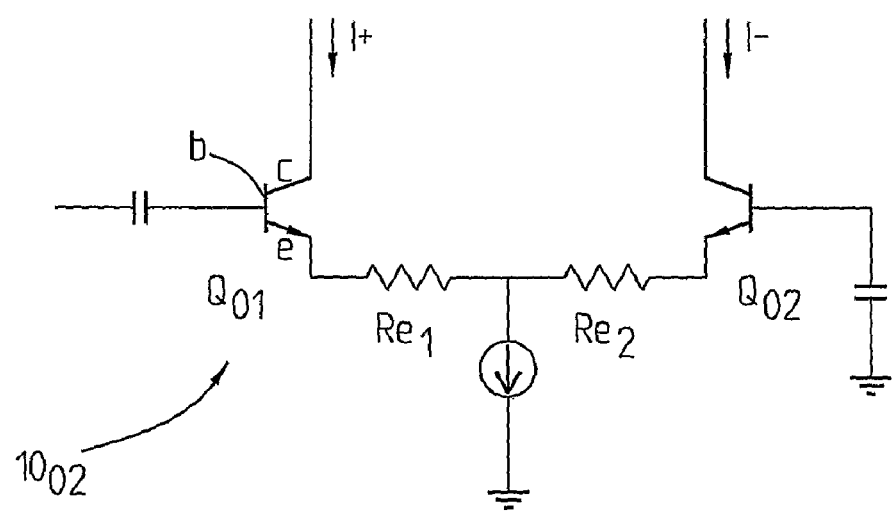
FIG. 2 shows an ECP transconductance stage as in FIG. 1 but with resistors for emitter degeneration.

FIG. 2 schematically illustrates a similar ECP transconductance stage $10_{02}$ but with resistors $R_{e1}$, $R_{e2}$ connected to the respective emitters for emitter degeneration purposes, which is a known measure to increase the linearity of an arrangement as in FIG. 1.

Figure 3:
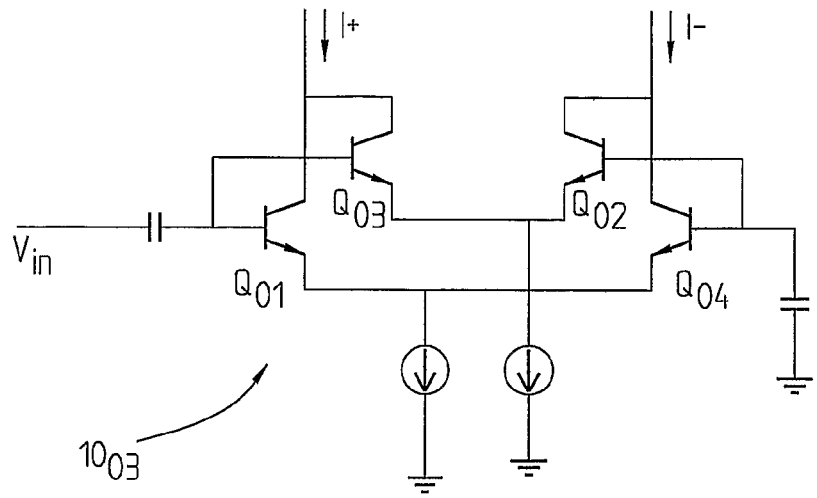
FIG. 3 shows another known transconductance stage comprising ECPs, the so-called multi-tan h doublet.

FIG. 3 shows a known multi-tan h doublet $10_{03}$. It also discloses another method for improving linearity. The sizes of $Q_{01}$ and $Q_{04}$ typically differ several times from the sizes of $Q_{02}$ and $Q_{03}$. However, all the emitter-coupled pairs are not satisfactory as far as linearity requirements are concerned for various applications, particularly due to the transconductance of the transistors decreasing considerably with an increasing input voltage applied across the bases of the transistors.

Figure 4:
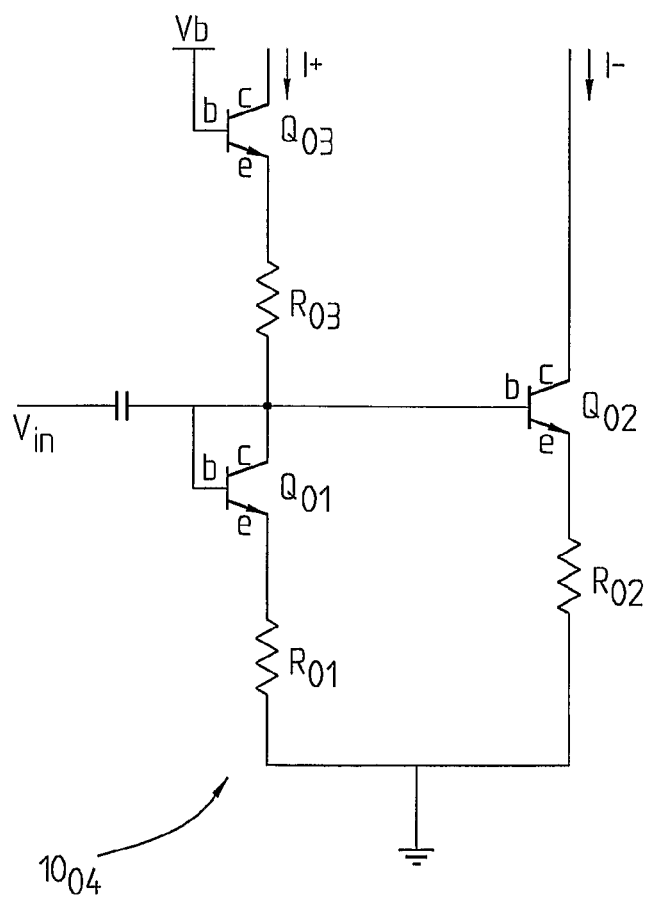
FIG. 4 shows the known transconductance stage used in a Micromixer.

FIG. 4 schematically shows a known so called micromixer $10_{04}$ according to one implementation, or more specifically the transconductance stage used in a micromixer. The output currents I+ and I− for a given input signal $V_{in}$ are equal in amplitude and opposite in phase. The resistors $R_{01}$, $R_{02}$, $R_{03}$, as also discussed above, are used to increase the input impedance. The linearity, however, goes down rapidly as the input RF power increases due to the fact that the DC component of the base emitter voltage of $Q_{02}$ and $Q_{03}$, i.e. $V_{BE}$ decreases with an increasing input power. As discussed above when the input power increases, the DC currents through the emitters of $Q_{02}$ and $Q_{03}$ increase and the DC voltage $V_{BE}(Q_{02})+V_{BE}(Q_{03})=V_b-I_{DC}(R_{03}+R_{02})$ decreases, $V_b$ being the biasing voltage at the $Q_{03}$ base.

Figure 5:
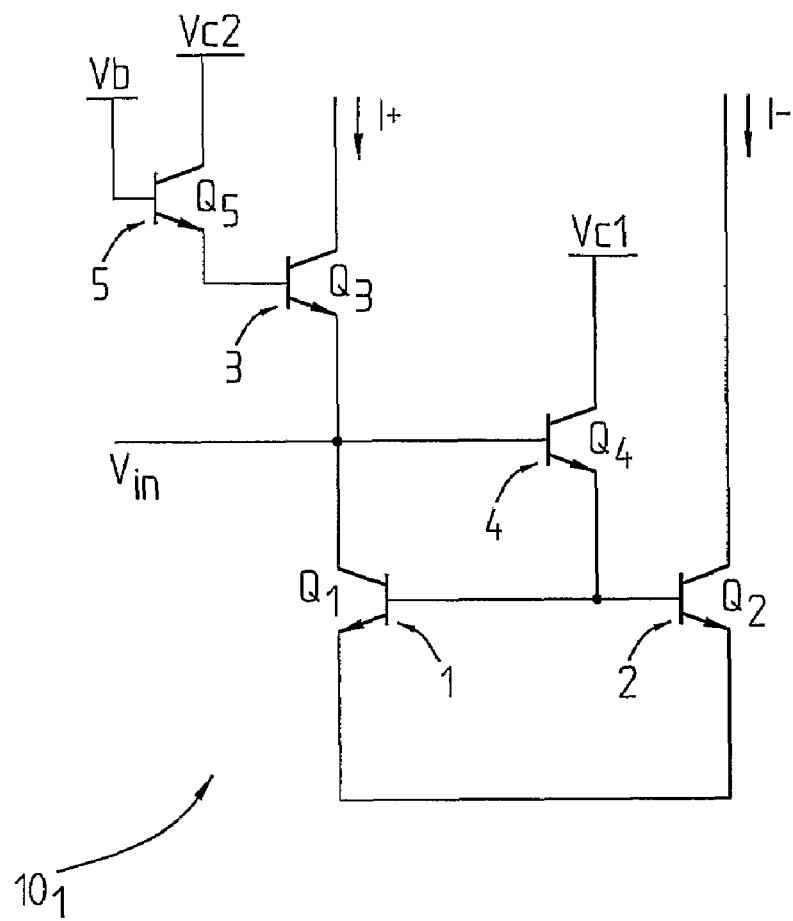
FIG. 5 shows a transconductance stage according to a first embodiment of the present invention.

FIG. 5 shows an arrangement according to the present invention wherein the problems with among others decreased linearity or deteriorated linearity at increasing input of power are reduced or overcome. In FIG. 5 a single ended input-to differential output transconductance stage $10_1$ is illustrated.

According to this embodiment of the invention two common collector transistors $Q_4$ 4, $Q_5$ 5 are provided or connected to the bases of $Q_2$ and $Q_3$ 2, 3 substantially corresponding to $Q_{02}$ and $Q_{03}$ of FIG. 4. Particularly transistor $Q_4$ 4, but also transistor $Q_5$ 5 plays a very important role in improving the linearity of the transconductance stage. Actually, instead of decreasing, the DC component of the base emitter voltage of $Q_2$ 2 ($V_{be}$) increases as the input power increases or keeps out of change, which is completely different from the arrangement shown in FIG. 4. As a result thereof, the transconductance stage is capable to tolerate larger input signals and its dynamic range will be extended to a large extend.

According to the invention the size of $Q_4$ 4 and $Q_5$ 5 respectively considerably exceeds the size of $Q_2$ 2 and $Q_3$ 3. The size here means the physical size i.e. the emitter width multiplying the length. The ratio of the emitter sizes may for example be as large as 10:1. It should be clear that this of course merely is one example and the ratio can be smaller as well as considerably larger as well for example down to 4:1 up to 20:1 or even more. This is to avoid that the AC voltage at input mainly is supplied to the base-emitter ports of $Q_4$ 4 and $Q_5$ 5. It should be noted that the AC voltage at input is split between the base-emitter port of $Q_2$ 2 and $Q_4$ 4, or $Q_3$ 3 and $Q_5$ 5.

Advantageously $Q_4$ 4 and $Q_5$ 5 are biased, in an off state such that their quiescent collector current will be extremely small since these currents form the base bias currents of $Q_2$ 2 and $Q_3$ 3. According to the invention the base-emitter voltage of $Q_4$ and $Q_5$ will decrease rapidly as the input power increases. This in turn will produce an increase in the corresponding DC voltages of $Q_2$ 2 and $Q_3$ 3. Hence, with a circuit configuration according to the present invention, the linearity of the transconductance stage will be improved, particularly at large RF input powers. Moreover, the input impedance is increased by adding $Q_4$ 4 and $Q_5$ 5 hence reducing or even eliminating the need of resistors $R_{01}$, $R_{02}$, $R_{03}$ as used in the Micromixer of FIG. 4 to boost the input impedance. In the embodiment of FIG. 5 such resistors are eliminated.

In another embodiment (not shown) only transistor Q 4 is provided as in FIG. 5, i.e. transistor $Q_5$ 5 is not included. In every other aspect of such an embodiment, the features correspond to the once discussed with reference to FIG. 5.

Figure 6:
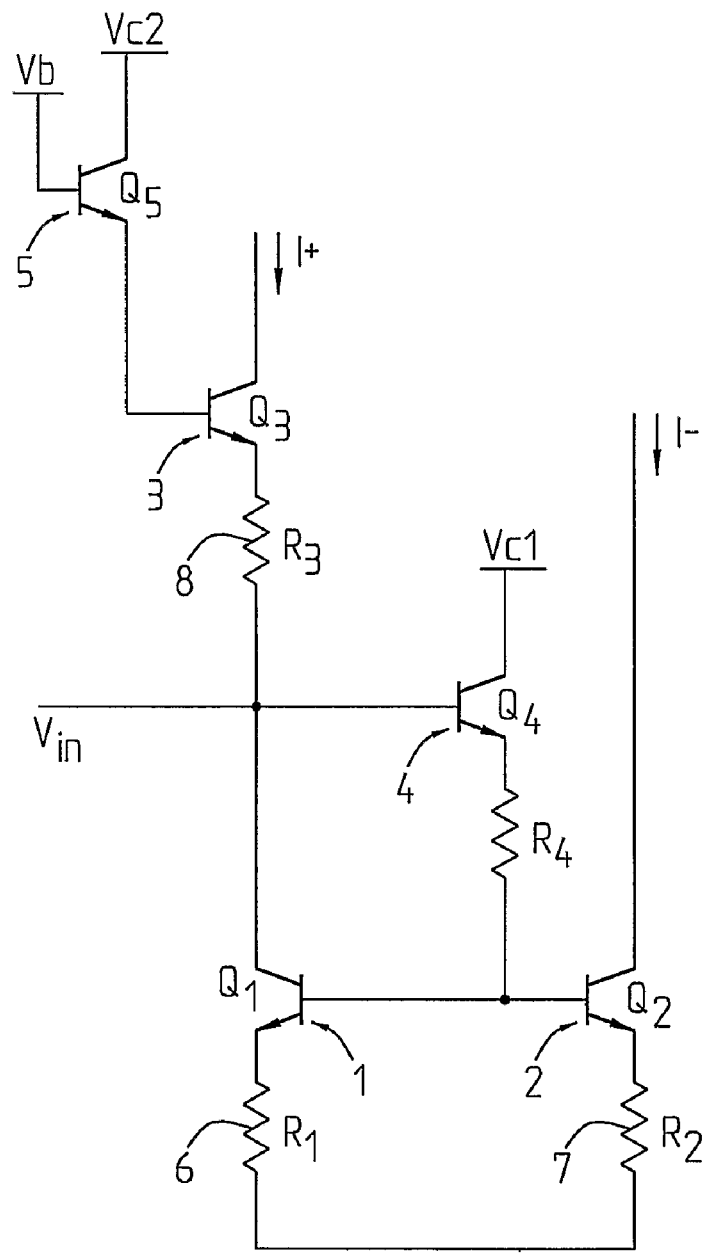
FIG. 6 shows a slightly modified embodiment of the transconductance stage of FIG. 5.

FIG. 6 shows another embodiment, similar to FIG. 5, with an arrangement $10_2$ in which resistors $R_1$, $R_2$, $R_3$, $R_4$ are provided in order to still further increase the input impedance though they need not have to be used as they do in the Micromixer shown in FIG. 4. This also applies to an embodiment as discussed above in which only transistor $Q_4$ 4 is provided. It should be noted that all or same of the resistors $R_1$-$R_4$ can be replaced by inductors.

Figure 7:
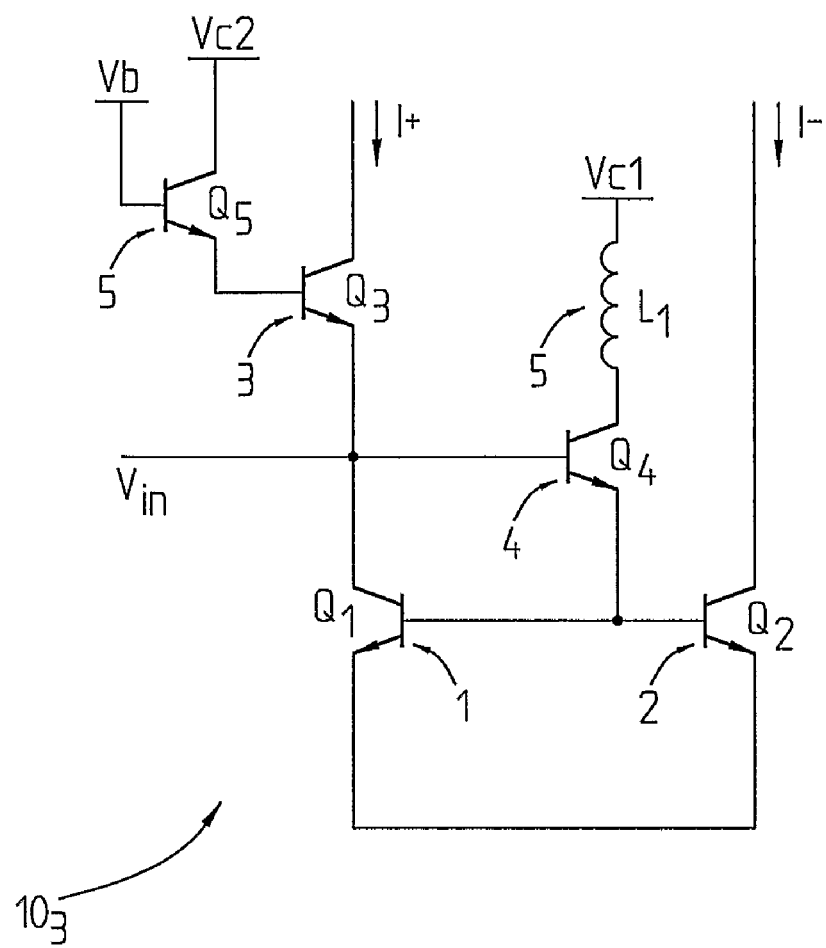
FIG. 7 shows another embodiment of the present invention with a collector loading inductor.

FIG. 7 shows an arrangement 103 in which an inductor $L_1$ is used as a collector load to $Q_4$. This inductor $L_1$ and the base collector junction capacitance of $Q_4$ 4 will form a series resonator that can be tuned such that the resonance occurs at $2\times\omega_0$, wherein $\omega_0$ denotes the frequency of the input signal. This means that the second harmonic of the input signal will be shorted to ground at the input further increasing the linearity. Although transistor $Q_5$ 5 is shown in FIG. 7, it should be clear that the inclusion of transistor $Q_5$ 5 relates to a particularly advantageous embodiment, the main thing being that transistor $Q_4$ 4 is included.

Particularly the transistors are implemented as bipolar transistors, in a most advantageous implementation. In an alternative implementation they are implemented as MOSFETs, or other MOS devices or similar. Most appropriate seem to be SiGe HBT and GaAs HBT implementations.

The implementation of an arrangement in IC design is straightforward and does not require any unusual measure or procedures. From the IC design point of view, the addition of transistor $Q_4$ or the two transistors, $Q_4$, $Q_5$ and possible one or more inductors e.g. in order to load $Q_4$ and/or $Q_5$, will not add to the complexity of the circuit or affect it in any substantial way, except for improving linearity. The noise figure might increase slightly.

It should be clear that although a part of the circuit consisting of transistors Q1, Q2 is in a form similar to a current mirror with a so called β helper $Q_4$, it should also be clear that they play fundamentally different roles and $Q_4$ according to present invention is an integrated part of the active transconductance stage. The input RF signal applies to $Q_4$. In contrast, in the current mirror construction the corresponding counterpart to $Q_4$ serves the purpose of DC biasing in order to stabilize the mirror current and it is entirely isolated from the input RF signal.

It should be clear that the invention can be varied in a number of ways within the scope of the appended claims and it is in no way limited to the explicitly discussed and illustrated embodiments but different materials and different sizes can be used and additional loads such as inductors and resistors etc can be added in order to provide for specific properties although they are not necessary for the concept of the invention.

The invention claimed is:

1. A voltage-to-current transconductance stage arrangement comprising a single-ended input, an emitter-coupled pair of transistors, comprising a first transistor and a second transistor, the emitter of a third transistor, being connected to the collector of said first transistor, and a differential output, wherein it further comprises a common-collector transistor comprising a fourth transistor connected to the base of said second transistor and in that the size of said fourth considerably exceeds the sizes of said second and third transistors.

2. A transconductance stage arrangement according to claim 1, wherein the fourth transistor further is connected to the emitter of the third transistor and preferably to the collector of the first transistor.

3. A transconductance stage arrangement according to claim 1, further comprising a fifth transistor connected to the base of said third transistor.

4. A transconductance stage arrangement according to claim 1, wherein the emitter size of said fourth or fourth and fifth transistor respectively considerably exceeds the emitter size of said second and third transistors.

5. A transconductance stage arrangement according to claim 4, wherein the emitter size of said fourth or fourth and fifth transistor respectively is about, or up to, N×the emitter size of the second and/or third transistor, where N is much less than 10.

6. A transconductance stage arrangement according to claim 4, wherein the emitter size of said fourth or fourth and fifth transistor respectively is more than N×the emitter size of said second and/or third transistor respectively, where N is greater than 10.

7. A transconductance stage arrangement according to claim 1 wherein the collector currents of said fourth (4) or fourth and fifth transistors are the base biasing currents of said second and third transistors respectively.

8. A transconductance stage arrangement according to claim 1, wherein the collector currents of said fourth or fourth and fifth transistors are biased in an off-state of the respective transistor in such way that they are extremely small.

9. A transconductance stage arrangement according to claim 6, wherein second biasing means are provided for biasing the collector currents of said fourth and/or fifth transistors in such a manner that said collector currents forming the base biasing currents of said second and third transistors become extremely small.

10. A transconductance stage arrangement according to claim 1, wherein for an increasing input power, the base-emitter voltage of said fourth or fourth and fifth transistors respectively is adapted to decrease rapidly such that the corresponding DC-voltage components of the base-emitter voltages of said second and third transistors increase, hence providing a good linearity also at large RF input power.

11. A transconductance stage arrangement according to claim 1, wherein said fourth or fourth and fifth transistors is/are arranged to increase the input impedance of said first and/or second and/or third transistors to a desired level.

12. A transconductance stage arrangement according to claim 11, wherein resistors or inductors are provided at or connected to the emitters of said first and/or second and/or third transistors in order to further increase the input impedance of said transistors.

13. A transconductance stage arrangement according to claim 1, wherein a load inductor is arranged to load the collector of the fourth transistor.

14. A transconductance stage arrangement according to claim 12, wherein the fourth transistor comprises a base-collector junction capacitor and in that said capacitor and the load inductor form a tunable series resonator.

15. A transconductance stage arrangement according to claim 14, wherein the input signal has a frequency $\omega_0$, and in that the tunable series resonator is adapted to be tuned such that resonance will occur at twice the input frequency, i.e. at $2\omega_0$ such that the second harmonic of the input signal will be shorted to ground at input.

16. A transconductance stage arrangement according to claim 1, wherein the transistors are bipolar transistors.

17. A transconductance stage arrangement according to claim 1, implemented in SiGe or GaAS.

18. A transconductance stage arrangement according to claim 1, further comprising an integrated circuit (IC).

19. A transconductance stage arrangement according to claim 1, wherein said fourth transistor or said fourth and fifth transistors is/are in off-state.

20. A mixer comprising a transconductance stage arrangement according to claim 1.

21. An amplifier comprising a transconductance stage arrangement according to claim 1.

22. Use of a transconductance stage arrangement according to claim 1 in a component in a wireless communication system.

* * * * *

UNITED STATES PATENT AND TRADEMARK OFFICE
CERTIFICATE OF CORRECTION

PATENT NO.        : 7,626,461 B2                                                Page 1 of 1
APPLICATION NO.   : 12/090710
DATED             : December 1, 2009
INVENTOR(S)       : Bao et al.

It is certified that error appears in the above-identified patent and that said Letters Patent is hereby corrected as shown below:

In Column 1, Line 54, delete "(EPC)" and insert -- (ECP) --, therefor.

In Column 2, Line 2, delete "EPC" and insert -- ECP --, therefor.

In Column 5, Line 47, delete "Q4" and insert -- $Q_4$ 4 --, therefor.

In Column 6, Line 17, delete "Q1, Q2" and insert -- $Q_1$, $Q_2$ --, therefor.

In Column 6, Line 67, in Claim 7, after "fourth" delete "(4)".

In Column 8, Line 17, in Claim 17, delete "GaAS." and insert -- GaAs. --, therefor.

Signed and Sealed this

Eleventh Day of May, 2010

David J. Kappos
*Director of the United States Patent and Trademark Office*